United States Patent
Shouji et al.

[11] Patent Number: 5,812,349
[45] Date of Patent: Sep. 22, 1998

[54] MAGNETIC HEAD APPARATUS INCLUDING SEPARATION FEATURES

[75] Inventors: Jun Shouji; Masanori Sakai, both of Miyotamachi; Kazumasa Fukuda, Komoro, all of Japan

[73] Assignee: TDK Corporation, Tokyo, Japan

[21] Appl. No.: 797,626

[22] Filed: Feb. 7, 1997

[30] Foreign Application Priority Data

Feb. 15, 1996 [JP] Japan .................................. 8-028345

[51] Int. Cl.⁶ .................................................. G11B 5/127
[52] U.S. Cl. ........................................... 360/110; 360/104
[58] Field of Search .................................. 360/110, 113, 360/104

[56] References Cited

U.S. PATENT DOCUMENTS

| | | | |
|---|---|---|---|
| 4,103,315 | 7/1978 | Hempstead et al. | 360/110 |
| 4,663,685 | 5/1987 | Tsang | 360/113 |
| 5,018,037 | 5/1991 | Krounbi et al. | 360/113 |
| 5,465,186 | 11/1995 | Bajorek et al. | 360/113 |
| 5,567,331 | 10/1996 | Kajitani | 360/113 X |
| 5,603,156 | 2/1997 | Biskeborn et al. | 360/113 X |

FOREIGN PATENT DOCUMENTS

| | | | |
|---|---|---|---|
| 57-3213A | 8/1982 | Japan | 360/110 |
| 7-85422 | 3/1995 | Japan . | |
| 7-141636 | 6/1995 | Japan . | |

*Primary Examiner*—John H. Wolff
*Attorney, Agent, or Firm*—Oblon, Spivak, McClelland, Maier & Neustadt, P.C.

[57] ABSTRACT

The present invention is directed to prevention of breakdown caused by electrostatic discharge in an MR element.

An MR element constitutes a read element. A head support device 2 supports a magnetic head 1. A lead wire 3 is constituted with at least a pair of lead wires 31 and 32 and each of the pair of lead wires 31 and 32 is connected to the read element at one end. A terminal board 5 is provided with at least one pair of terminal conductors 52 and 53 on top of a hard substrate 51. The pair of terminal conductors 52 and 53 are provided with connecting areas 54 and 55 respectively on the same side, to which one end of which are connected the other ends of the lead wires 31 and 32 respectively. The pair of terminal conductors 52 and 53 are electrically shorted from each other by a shorting portion 56 at a rearward position which is away from the connecting areas 54 and 55 over a distance. The substrate 51 is provided with grooves or perforations 57 which facilitate the cutting operation between the shorting portion 56 and the connecting areas 54 and 55.

5 Claims, 8 Drawing Sheets

MAGNETIC HEAD APPARATUS INCLUDING SEPARATION FEATURES

BACKGROUND OF THE INVENTION

1. Field of the Invention

The present invention relates to a magnetic head apparatus and, to be more specific, it relates to a magnetic head apparatus provided with a magnetoresistive (MR) element.

2. Discussion of Background

A thin film magnetic head which employs an MR element as a read element is suitable for reading information that is recorded on a magnetic recording medium at high density, since its output is independent of the speed of the head relative to the magnetic disk. The technical literature which discloses examples of such a magnetic head in the prior art includes, for instance, Japanese Unexamined Patent Publication (KOKAI) No. 40610/1987, U.S. Pat. No. 4,103,315 and Japanese Unexamined Patent Publication (KOKAI) No. 125311/1991.

As these publications disclose, an MR element is formed through thin film technology and its current capacity is extremely small. Because of this, if an electrostatic charge from the body of a worker handling the magnetic head assembly is applied to the magnetic head assembly during manufacturing or assembly processes, an excess current will run through the MR element, which can easily result in breakdown caused by electrostatic discharge.

As a means for preventing such breakdown caused by electrostatic discharge, Japanese Unexamined Patent Publication (KOKAI) No. 85422/1995 discloses a technology whereby an inductive magnetic conversion element and an MR element are shorted from each other by a substance with a resistance of $10^3$ to $10^9$ $\Omega$cm and at least one electrode is connected between a pair of terminals that are connected to the MR element. However, in this prior art, a substance with a resistance of $10^3$ to $10^9$ $\Omega$cm is required to short the inductive magnetic conversion element from the MR element and, furthermore, a diode, which is essentially not required to achieve the functions of the MR element, must be connected.

In addition, Japanese Unexamined Patent Publication (KOKAI) No. 141636/1995 discloses a technology whereby, in a structure in which a flexible printed board is employed as a lead conductor for the MR element, two terminals that are connected to the MR element are shorted during the manufacturing and assembly processes and the flexible printed board is cut prior to the characteristics measurement following the assembly work, to open the shorted area. However, this prior art may be adopted only when a flexible printed board is employed, and the technology does not take into consideration the possibility of using a twisted pair wire for the lead wire, which is often the case in this type of thin film magnetic head. Moreover, the flexible printed board must be cut using a special cutting tool. Furthermore, if a flexible printed board is employed, a probe must be used when connecting a characteristics measuring device.

SUMMARY OF THE INVENTION

It is an object of the present invention to provide a magnetic head apparatus in which breakdown caused by electrostatic discharge of an MR element can be prevented.

It is a further object of the present invention to provide a magnetic head apparatus in which breakdown caused by electrostatic discharge of an MR element can be prevented without requiring any additional parts such as diodes.

It is a still further object of the present invention to provide a magnetic head apparatus with a thin film magnetic head employing twisted pair wire, in which a breakdown caused by electrostatic discharge in the MR element can be prevented.

It is a still further object of the present invention to provide a magnetic head apparatus in which cutting for opening the circuit can be performed manually without using a special cutting tool.

It is a still further object of the present invention to provide a magnetic head apparatus in which a connector is formed which, without further modification, may be inserted into a characteristics measuring device after the cutting for opening the circuit is performed.

In order to achieve the objects described above, the magnetic head apparatus according to the present invention includes a magnetic head, a head support device, a lead wire and a terminal board. The magnetic head is provided with a slider and one or more magnetic conversion elements mounted on the slider. At least one of the magnetic conversion elements is a read element which utilizes the magnetoresistance effect. The head support device supports the magnetic head. The lead wire is constituted of at least a pair of wires, and each of the wires is connected to the read element at one end. The terminal board is provided with at least one pair of terminal conductors on a hard substrate. Each of the pair of terminal conductors is provided with a connecting area on the same side where the other end of the lead wire is connected at one end and is shorted from the other at a shorting portion at a rearward position, distanced from the connecting area. The substrate is provided with a groove or perforations to facilitate cutting in an area between the shorting portion and the connecting areas.

Each of the pair of wires is connected to the read element at one end. Each of the pair of terminal conductors provided at the terminal board is provided with a connecting area at one end where the other end of the lead wire is connected and is electrically shorted from the other at the shorting portion. In this structure, while a worker handles the magnetic head apparatus, if the electrostatic charge in the worker's body is applied to the magnetic head apparatus, a current will run through the shorting portion where the resistance is much lower than that in the MR element. This prevents breakdown caused by electrostatic discharge in the MR element.

Since the prevention of breakdown caused by electrostatic discharge is achieved by shorting the terminal conductors provided at the terminal board, breakdown caused by electrostatic discharge in the MR element can be prevented without requiring an additional part such as a diode.

The lead wire is constituted of at least one pair of wires and each of the pair of wires is connected to the read element at one end. A typical example of such a lead wire as described above is a twisted pair wire. Consequently, breakdown caused by electrostatic discharge in the MR element can be prevented in a thin film magnetic head that employs twisted pair wire.

The substrate, which constitutes the terminal board, is provided with a groove or perforations to facilitate cutting in the area between the shorting portion and the lead wire connecting areas. Consequently, by cutting the substrate in the area where the groove or perforations are provided, the circuit constituted of the lead wire and the MR element can be opened. Thus, by connecting the terminal board to a characteristics measuring device, the characteristics measurement work can be executed.

In this structure, the cutting portion is formed by providing a groove or perforations in the substrate. As a result, the worker can split the substrate along the groove or perforations in order to open the circuit. Because of this, it is possible to perform the cutting work for opening the circuit without employing a special cutting tool.

The terminal board employs a hard substrate. Thus, unlike a flexible printed board, the terminal board itself can be used as a connector without further modification, which may be inserted to a characteristics measuring device. This facilitates and expedites the characteristics measurement work and contributes to an improvement in reliability and the like.

BRIEF DESCRIPTION OF THE DRAWINGS

These and other advantages, features and objects of the present invention will be understood by those of ordinary skill in the art referring to the annexed drawings, given purely by way of non-limitative example, in which.

DETAILED DESCRIPTION OF THE PREFERRED EMBODIMENTS

Figure 1:
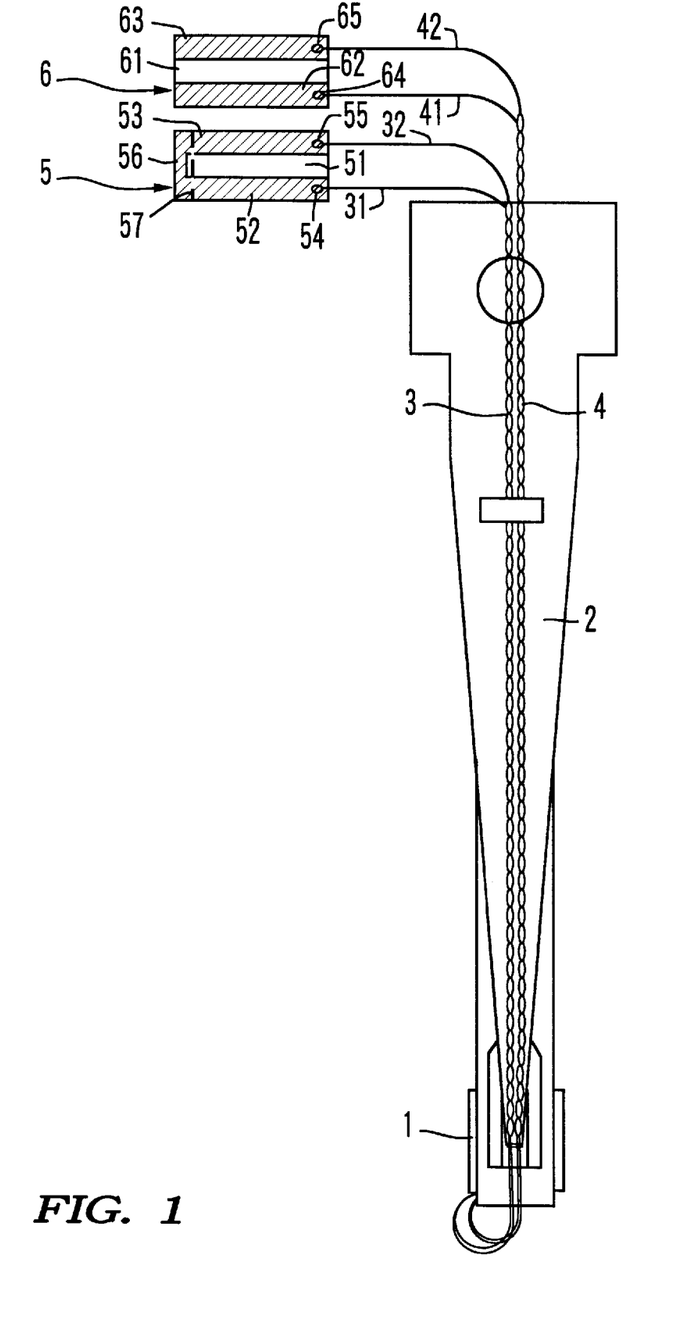
FIG. 1 is a plan view of the magnetic head apparatus according to the present invention.
Figure 2:
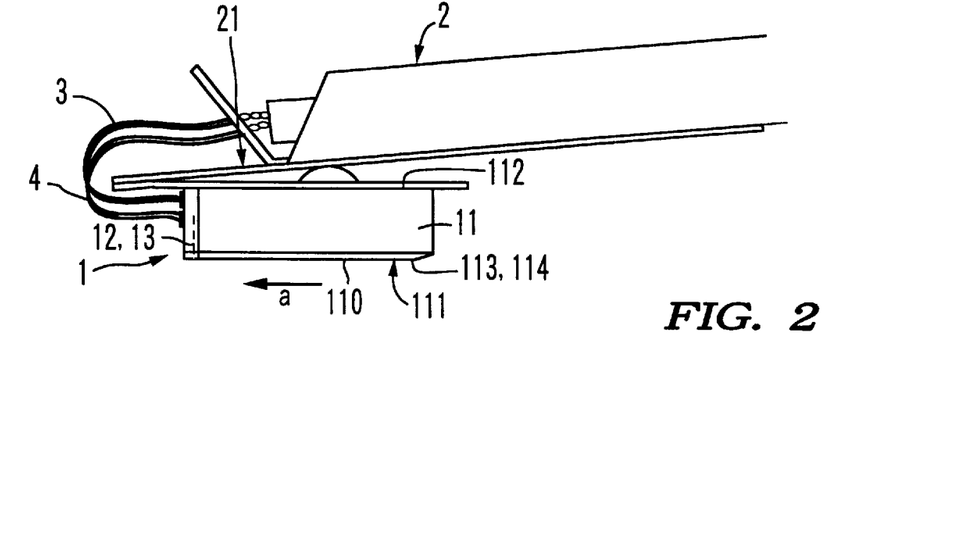
FIG. 2 is an enlarged front view of the magnetic head mounting portion in the magnetic head apparatus shown in FIG. 1.
Figure 3:
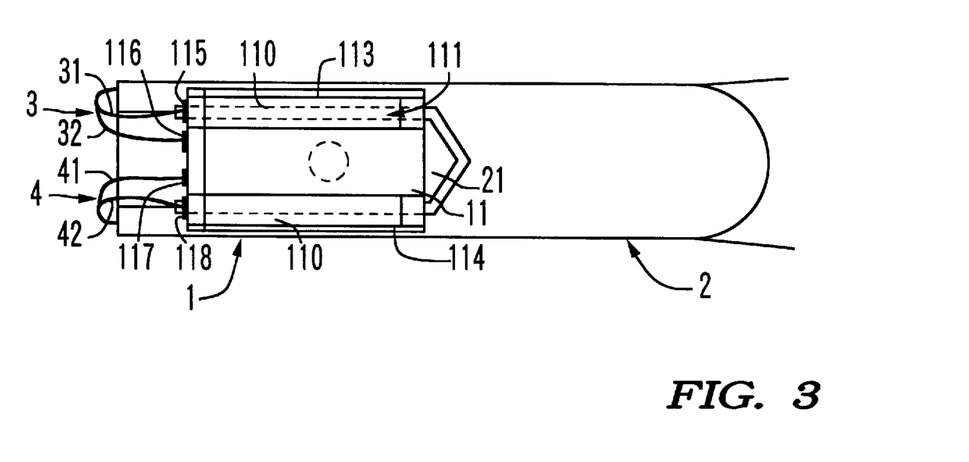
FIG. 3 is an enlarged bottom view of the magnetic head mounting portion in the magnetic head apparatus shown in FIG. 1.

Referring to FIGS. 1 to 3, the magnetic head apparatus according to the present invention, comprises a magnetic head 1, a head support device 2, two sets of lead wires 3 and 4, and two terminal boards 5 and 6.

The magnetic head 1 is provided with a slider 11 and magnetic conversion elements 12 and 13. One side of the slider 11 constitutes a medium-facing surface 111 and the surface on the other side constitutes a supporting surface 122. While the medium-facing surface 111 of the slider 11 may sometimes be provided with 1 to 3 rail portions, it may also be a flat surface without any rail portions. In addition, various geometric shapes may be added to the contour of the medium-facing surface 111 in order to achieve an improvement in the flying characteristics and the like. The present invention may be adopted in any one of the types of sliders mentioned above. The surface of the medium-facing surface 111 that projects out the farthest constitutes an air bearing surface with a high degree of finish. The slider 11 shown in the figures is provided with two rail portions 113 and 114 at the medium-facing surface 111 and the surfaces of the rail portions 113 and 114 are utilized as air bearing surfaces 110.

The magnetic conversion elements 12 and 13 are mounted on a side surface of the slider 11, and they are provided with bumps 115, 116, 117 and 118, which emerge on the outside of the slider 11. The magnetic conversion elements 12 and 13 are provided at the trailing edge when viewed along the direction of medium travel (the direction of air outflow), which is indicated with the arrow a. The magnetic conversion elements 12 and 13 are thin film elements that are manufactured through processes similar to those employed in IC manufacturing technology.

Figure 4:
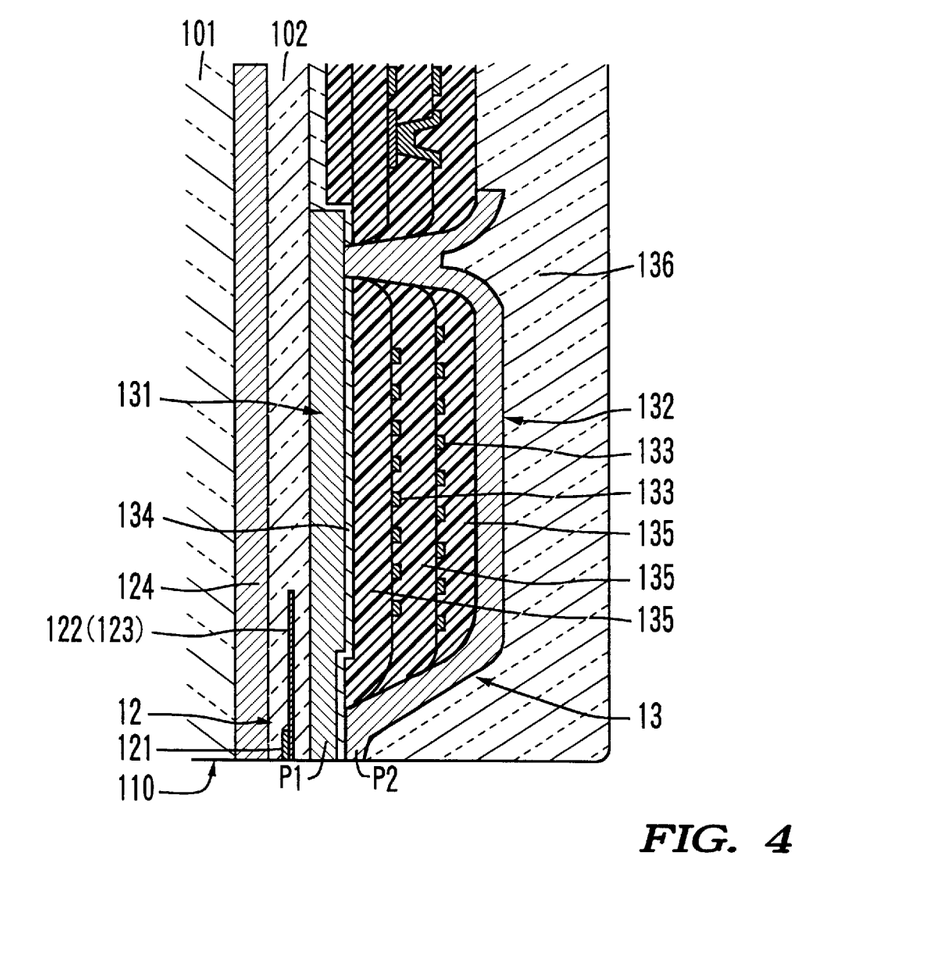
FIG. 4 is an enlarged cross section of the magnetic conversion element in the magnetic head.

FIG. 4 is a cross section showing a portion of the magnetic conversion elements 12 and 13 of the magnetic head 1 in an enlargement. Of the magnetic conversion elements 12 and 13, the magnetic conversion element 12 is a read element, which utilizes the magnetoresistance effect, whereas the magnetic conversion element 13 is an inductive write element.

Figure 5:
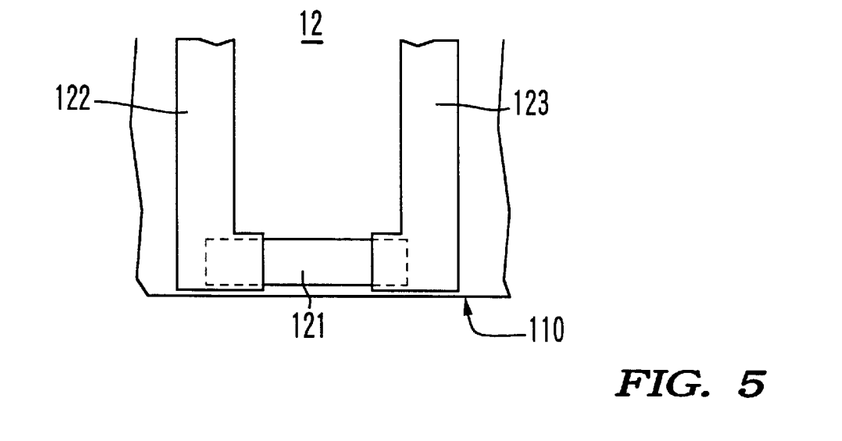
FIG. 5 is a schematic structure of an MR element.

FIG. 5 is a schematic diagram of the structure of the MR element 12. The MR element 12 includes a central active area 121 and end passive areas 122 and 123. The central active area 121 is an area where the magnetoresistance effect is generated. Various film structures have been proposed to constitute this area and have been put to practical use. They include, for instance, an area employing an anisotropic magnetoresistance effect element constituted of permalloy or the like and a structure employing a giant magnetoresistance (GMR) effect film. In the present invention, the central active area 121 may be either of the above types. The end passive areas 122 and 123 are connected to the two side surfaces of the central active area 121. The main functions of the end passive areas 122 and 123 are bonding with the central active area 121 and supplying a sense current. The end passive areas 122 and 123 are continuous with the bumps 115 and 116 (see FIG. 3).

The magnetic conversion element 13, which functions as a write element, is provided with a lower magnetic film 131 that also constitutes an upper shield film, an upper magnetic film 132, a coil film 133, a gap film 134 that is constituted of alumina or the like, an insulating film 135 that is constituted of an organic resin such as Novolak Resin, a protective film 136 and the like, as shown in FIG. 4. The front end portions of the lower magnetic film 131 and the upper magnetic film 132 constitute pole portions P1 and P2, which face opposite each other across the gap film 134 whose thickness is minimal, and write is performed at the pole portions P1 and P2. The yolk portions of the lower magnetic film 131 and the upper magnetic film 132 are linked to each other in a back gap portion which is on the opposite side from the pole portions P1 and P2, to complete the magnetic circuit. The coil film 133 is formed on top of the insulating film 135 in such a manner that the coil film 133 winds around the linking area of the yolk portion in a coil shape. The two ends of the coil film 133 are continuous with the bumps 117 and 118 (see FIG. 3). In FIG. 4, reference number 124 indicates a lower shield film, reference number 101 indicates a substrate and reference number 102 indicates an insulating film.

Next, as shown in FIGS. 2 and 3, one end of the head support device 2 in the lengthwise direction constitutes a fixed end while the other end constitutes a free end. The head support device 2 is provided with a flexible supporting portion 21 toward the free end, with the flexible supporting portion 21 mounted at the supporting surface 124 of the slider 11. The head support device 2 supports the magnetic head 1 so that the magnetic head 1 can move in conformance with surface fluctuations of the magnetic disk (not shown). Various types of such head support devices have been proposed in the prior art and have been put to practical use. In the head support device 2 shown in the figures, the flexible supporting portion 21 constitutes a gimbal which allows a rolling motion around a first axis, which is taken in the lengthwise direction, and a pitching movement around a second axis, which runs perpendicular to the first axis, and the supporting surface 112 of the slider 11 constituting the magnetic head 1 is linked to its lower surface by means such as bonding.

Of the lead wires 3 and 4, the lead wire 3 is provided for the MR element 12, which constitutes the read element, and the lead wire 4 is provided for the magnetic conversion element 13, which constitutes the write element. The lead wire 3 is constituted of a pair of wires 31 and 32. The wires 31 and 32 are stranded together. This type of lead wire 3 is normally referred to as a twisted pair wire. Each of the wires 31 and 32 is connected to the MR element 12 constituting the read element at one end. To be more specific, the wires 31 and 32 are connected to the bumps 115 and 116 respectively (see FIGS. 2 and 3) and they are continuous with the end passive areas 122 and 123 respectively of the MR element 12 shown in FIG. 5.

In this embodiment, the lead wire 4, too, is constituted with a pair of wires, i.e., wires 41 and 42, which together constitute a twisted pair wire. The wires 41 and 42 are connected to the bumps 117 and 118 (see FIGS. 2 and 3) at one end and they are connected to the coil film 133 (see FIG. 4) of the magnetic conversion element 13.

Figure 6:
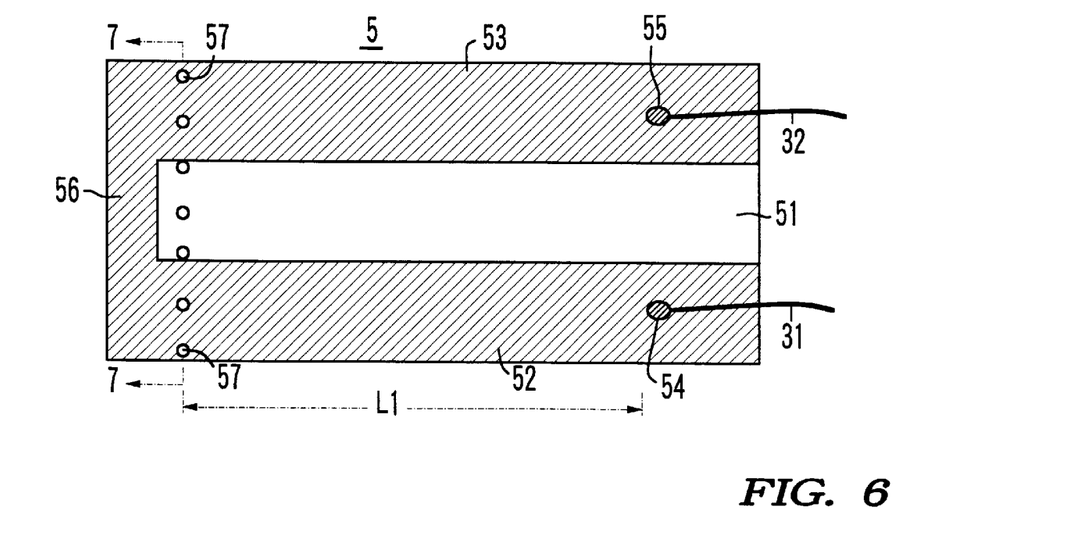
FIG. 6 is an enlarged plan view of a terminal board for the MR element which is to constitute a read element.
Figure 7:
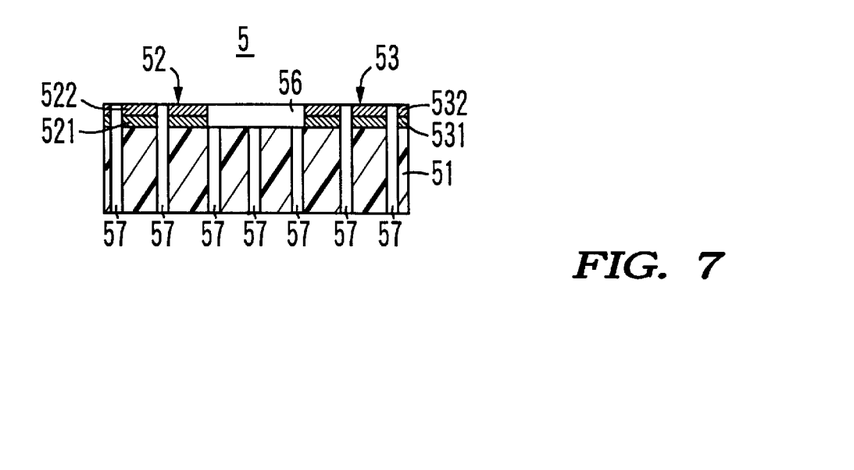
FIG. 7 is a cross section of FIG. 6 through line 7—7.

Further explanation is given in reference to FIG. 1 again. Of the terminal boards 5 and 6, the terminal board 5 for the MR element 12 (see FIGS. 2 and 3) is provided with a pair of terminal conductors 52 and 53 on a hard substrate 51. FIG. 6 is a plan view showing an embodiment of the terminal board and FIG. 7 is a cross section of FIG. 6 through line 7—7. In these figures, the pair of terminal conductors 52 and 53 are provided with connecting areas 54 and 55 respectively on the same side, to one end of which are connected the other ends of the wires 31 and 32 respectively. The terminal conductors 52 and 53 are electrically shorted by a shorting portion 56 at a rearward position, away from the connecting areas 54 and 55 over a distance L1. The shorting portion 56 is formed of a conductor constituted of the same material as that constituting the terminal conductors 52 and 53. The terminal conductors 52 and 53 and the shorting portion 56 may be formed by applying the technology through which a conductor pattern is formed on a printed circuit board. In this embodiment, first conductive layers 521 and 531 each constituted of a copper foil pattern are formed on top of the substrate 51, which is constituted of paper - phenol, and on top of the first conductive layers 521 and 531, second conductive layers 522 and 532, which are constituted of solder plating, are laminated.

In addition, the substrate 51 of the terminal board 5 is provided with perforations 57 between the shorting portion 56 and the connecting areas 54 and 55 in order to facilitate cutting. In this embodiment, there are several perforations 57 and they are linearly aligned.

As in the case of the terminal board 5, the terminal board 6 for the magnetic conversion element 13, is provided with a pair of terminal conductors, i.e., terminal conductors 62 and 63, on top of a hard substrate 61. The pair of terminal conductors 62 and 63 are provided with connecting areas 64 and 65 respectively on the same side, to one end of which are connected the other ends of the wires 41 and 42. However, it has no shorting portion or cutting portion.

As described above, of the lead wires 3 and 4, the pair of wires 31 and 32 of the lead wire 3 are connected at one end to the MR element 12. The pair of terminal conductors 52 and 53 provided at the terminal board 5 are provided with the connecting areas 54 and 55 respectively on the same side, to one end of which are connected the other ends of the wires 31 and 32 and also they are electrically shorted by the shorting portion 56. In this structure, if an electrostatic charge in the body of the worker is applied to the magnetic head apparatus while the worker is handling the magnetic head apparatus, the electric current runs through the shorting portion 56 where the resistance is much lower than that at the MR element 12. Thus, breakdown caused by electrostatic discharge in the MR element 12 is prevented.

Since breakdown caused by electrostatic discharge is prevented by shorting the terminal conductors 52 and 53 provided at the terminal board 5 with the shorting portion 56, which is likewise provided at the terminal board 5, it is possible to prevent breakdown caused by electrostatic discharge in the MR element 12 without requiring any additional part such as a diode or the like.

The lead wire 3 is constituted with at least a pair of wires 31 and 32. A typical example of such a lead wire 3 is a twisted pair wire. As a result, breakdown caused by electrostatic discharge in the MR element 12 can be prevented in a thin film magnetic head which employs twisted pair wire.

Figure 8:
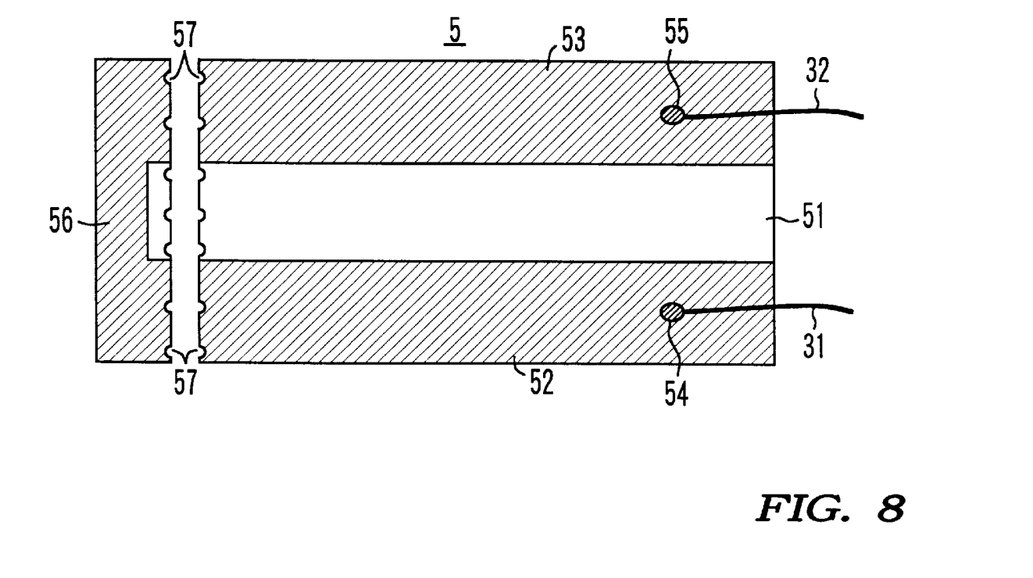
FIG. 8 is the terminal board shown in FIG. 6, which has been cut to open the circuit.

FIG. 8 illustrates a cutting operation performed on the terminal board 5 shown in FIG. 6 performed to open the circuit. As described above, the substrate 51 constituting the terminal board 5 is provided with the perforations 57 to facilitate the cutting operation between the shorting portion 56 and the connecting areas 54 and 55 where the lead wires are connected. Consequently, as shown in FIG. 8, by cutting the substrate 51 at the area where the perforations 57 are provided, the circuit constituted with the lead wire 3 and the MR element 12 can be opened.

In this structure, the cutting portion is formed by providing the perforations 57 at the substrate 51. As a result, in order to open the circuit, the worker can split the substrate 51 manually along the perforations 57. Thus, it is possible to perform the cutting operation for opening the circuit without using a special cutting tool.

Figure 9:
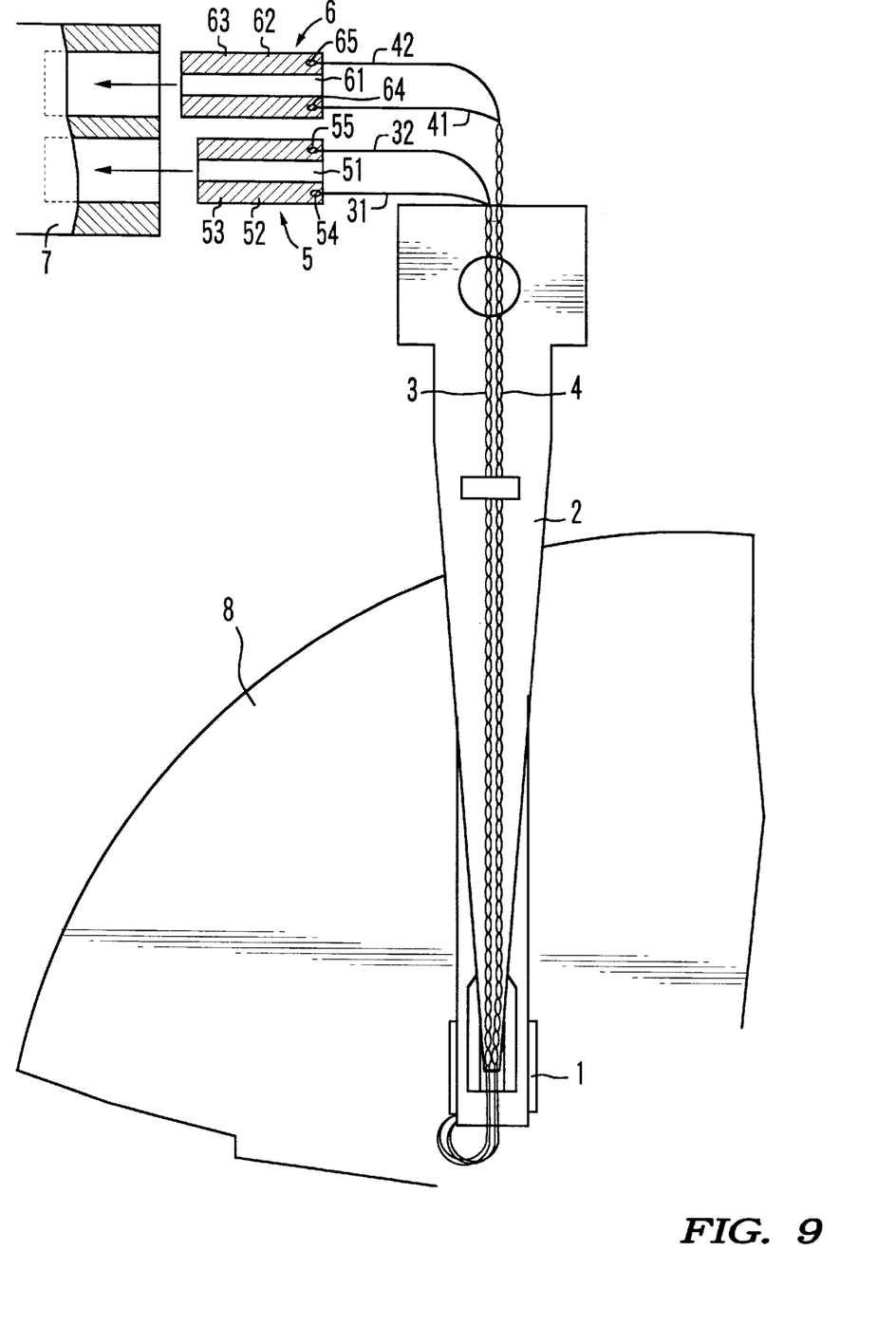
FIG. 9 is an illustration of the characteristics measurement work performed on the magnetic head apparatus according to the present invention.

FIG. 9 illustrates the characteristics measurement work performed on the magnetic head apparatus according to the present invention. After the circuit is opened, the magnetic head apparatus according to the present invention is subjected to an inspection process for inspecting the electromagnetic conversion characteristics and the like. Since the terminal board 5 is provided with the hard substrate 51, unlike a flexible printed board, the terminal board 5 can be employed without further modification as a connector to be inserted directly into a characteristics measuring device 7, as shown in FIG. 9. This not only facilitates and expedites the characteristics measurement work but also contributes to an improvement in reliability and the like. Reference number 8 indicates a magnetic disk.

In this embodiment, the terminal board 6 for the magnetic conversion element 13, too, employs a hard substrate, i.e., the substrate 61, and is provided with similar terminal conductors 62 and 63. Thus, the terminal board 6, too, may be employed as a connector.

Figure 10:
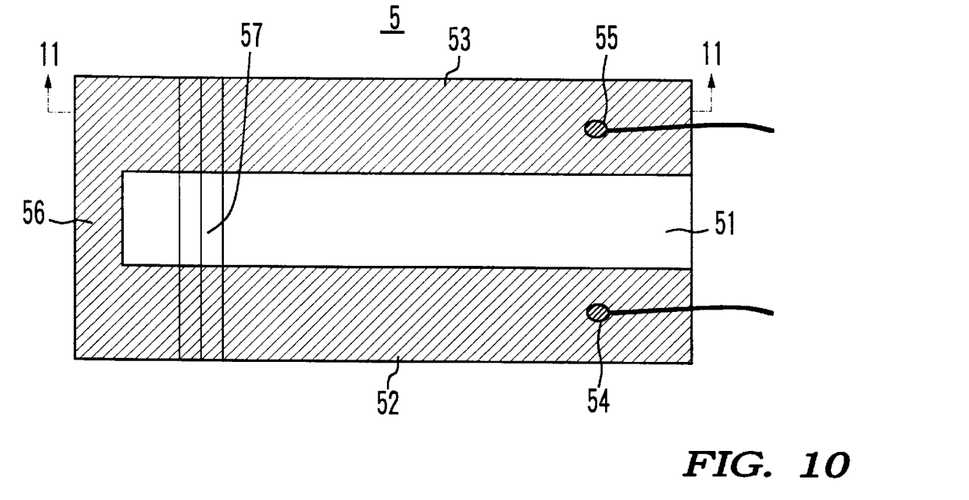
FIG. 10 is an enlarged plan view of another embodiment of the terminal board which may be employed in the magnetic head apparatus according to the present invention.
Figure 11:
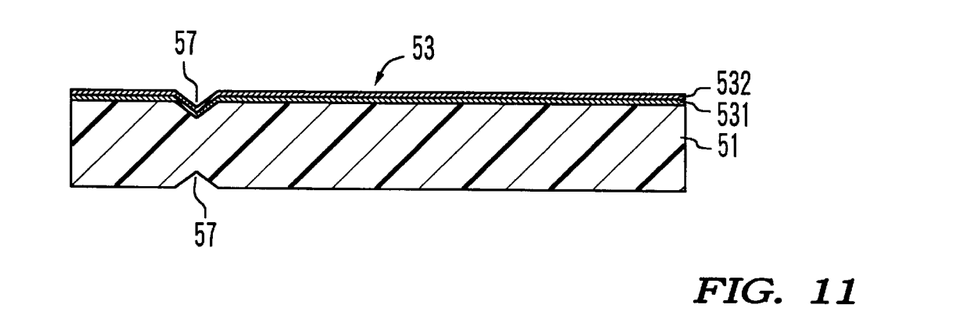
FIG. 11 is a cross section of FIG. 10 through line 11—11.

FIG. 10 is a plan view showing another embodiment of the terminal board 5 and FIG. 11 is a cross section of FIG. 10 through line 11—11. In this embodiment, in place of the perforations, the substrate 51 is provided with grooves 57 to facilitate cutting. The grooves 57 may be formed, for instance, in a V shape. It is to be also noted that it is desirable to provide the grooves 57 at two surfaces of the substrate 51 at positions that face opposite each other.

Figure 12:
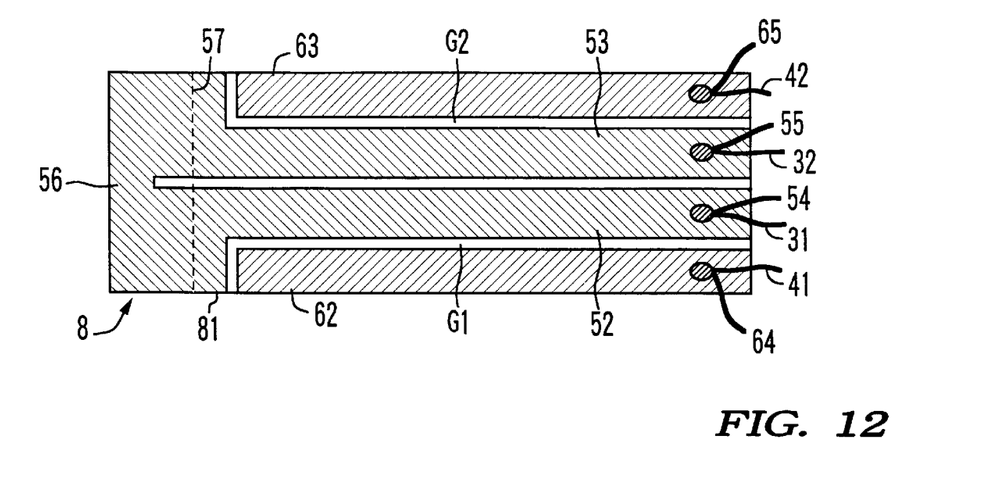
FIG. 12 is a plan view of another embodiment of the terminal board which may be employed in the magnetic head apparatus according to the present invention.

FIG. 12 is a plan view showing another embodiment of the terminal board. In this embodiment, two sets of terminal conductors (52, 53) and (62, 63) are provided on a single substrate 81 which constitutes a terminal board 8. The wires 31 and 32 leading from the MR element 12 are connected to the terminal conductors 52 and 53 respectively. The terminal conductors 52 and 53 are shorted by a shorting portion 56. The wires 41 and 42 leading from the magnetic conversion element 13 are connected to the terminal conductors 61 and 63 respectively. The terminal conductors 62 and 63 are separated from the terminal conductors 52 and 53 by gaps G1 and G2 respectively. Between the shorting portion 56 and connecting areas (54, 55) and (64, 65), grooves or perforations 57 for facilitating the cutting operation are provided.

Figure 13:
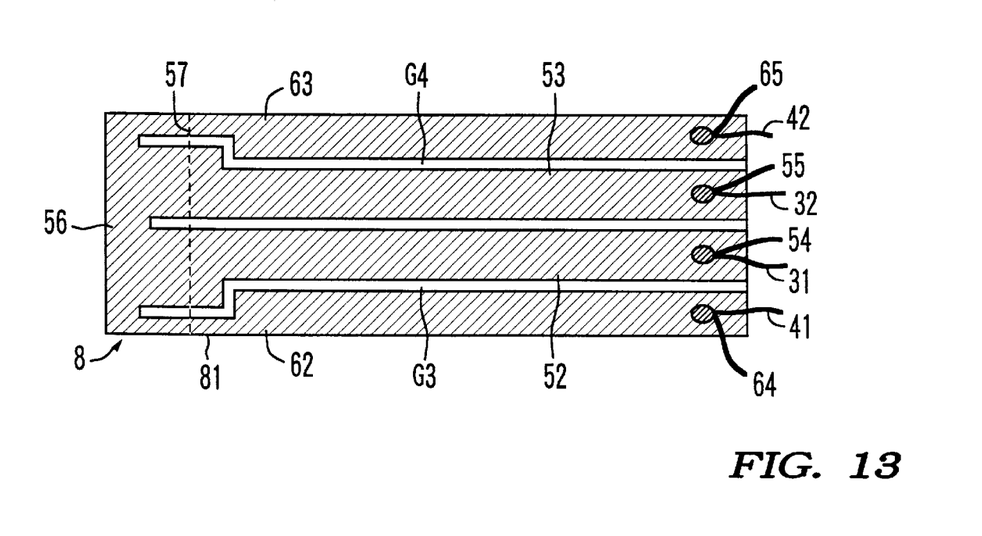
FIG. 13 is a plan view of yet another embodiment of the terminal board which may be employed in the magnetic head apparatus according to the present invention.

FIG. 13 is a plan view showing another embodiment of the terminal board. In this embodiment, two sets of terminal conductors (52, 53) and (62, 63) are provided on a single substrate 81 constituting a terminal board 8. The terminal conductors 52 and 53 and the terminal conductors 62 and 63 are electrically shorted by a shorting portion 56 at a rearward position that is distanced from the connecting areas 54 and 55 over a distance. The wires 31 and 32 leading from the MR element 12 are connected to the terminal conductors 52 and 53 respectively. The wires 41 and 42 of the lead wire 4 led from the magnetic conversion element 13 are connected to the terminal conductors 62 and 63 respectively. The terminal conductors 62 and 63 are separated from the terminal conductors 52 and 53 by gaps G3 and G4 respectively. Grooves or perforations 57 for facilitating the cutting operation are provided between the shorting portion 56 and the connecting areas (54, 55) and (64, 65).

It will be obvious to a person skilled in the field to which the invention pertains that effects and advantages similar to those explained in reference to FIGS. 1 to 9 are achieved when one of the terminal boards shown in FIGS. 10 to 13 is employed.

As has been explained, according to the present invention, the following advantages are achieved:

a) A magnetic head apparatus in which breakdown caused by electrostatic discharge in the MR element is prevented, is provided.

b) A magnetic head apparatus in which breakdown caused by electrostatic discharge in the MR element is prevented without requiring any additional part such as a diode or the like, is provided.

c) A magnetic head apparatus provided with a thin film magnetic head employing twisted pair wire, in which breakdown caused by electrostatic discharge in the MR element is prevented, is provided.

d) A magnetic head apparatus in which cutting operation for opening the circuit can be performed without employing a special cutting tool, is provided.

e) A magnetic head apparatus in which a connector that can be directly inserted without further modification into characteristics measuring device following the cutting operation for opening the circuit is formed, is provided.

What is claimed is:

1. A magnetic head apparatus comprising:

a magnetic head having a slider and one or more magnetic conversion elements positioned at said slider, at least one of said magnetic conversion elements being a read element utilizing a magnetoresistance effect;

a head support device configured to support said magnetic head;

a lead having a pair of lead wires, one end of each of said pair of lead wires being connected to said read element;

a terminal board having a pair of terminal conductors on a hard substrate, said pair of terminal conductors each having a first end and a second end, said second end having a connecting area that connects to respective other ends of said pair of lead wires, said pair of terminal conductors being electrically shorted to each other at a shorting portion located in an inclusive range between said connecting area and said first end; and said hard substrate being provided with at least one of a groove and a perforation to facilitate cutting in an area between said shorting portion and said connecting area.

2. A magnetic head apparatus according to claim 1, wherein:

said hard substrate includes said groove; and said groove is formed V-shaped.

3. A magnetic head apparatus according to claim 1, wherein:

said hard substrate includes said perforation, said perforation comprises laterally aligned holes.

4. A magnetic head apparatus according to claim 1, wherein:

said magnetic head includes a write magnetic conversion element.

5. A magnetic head apparatus according to claim 1, wherein:

said head support device, with one end thereof in a lengthwise direction constituting a fixed end and another end thereof constituting a free end, is provided with a flexible supporting portion toward said free end and said flexible supporting portion is mounted at said supporting surface of said slider.

* * * * *